US008924827B2

(12) United States Patent
Kodavalla

(10) Patent No.: US 8,924,827 B2
(45) Date of Patent: Dec. 30, 2014

(54) METHODS AND SYSTEMS FOR MINIMIZING DECODING DELAY IN DISTRIBUTED VIDEO CODING

(71) Applicant: Vijay Kumar Kodavalla, Bangalore (IN)

(72) Inventor: Vijay Kumar Kodavalla, Bangalore (IN)

(73) Assignee: Wipro Limited, Bangalore (IN)

( * ) Notice: Subject to any disclaimer, the term of this patent is extended or adjusted under 35 U.S.C. 154(b) by 128 days.

(21) Appl. No.: 13/752,650

(22) Filed: Jan. 29, 2013

(65) Prior Publication Data

US 2014/0122962 A1    May 1, 2014

(30) Foreign Application Priority Data

Oct. 31, 2012    (IN) .............................. 4543/CHE/2012

(51) Int. Cl.
*H03M 13/00* (2006.01)
*H03M 13/29* (2006.01)
*H03M 13/37* (2006.01)

(52) U.S. Cl.
CPC ...... *H03M 13/2909* (2013.01); *H03M 13/3746* (2013.01); *H03M 13/6312* (2013.01)
USPC ............ 714/785; 714/704; 714/755; 714/758

(58) Field of Classification Search
CPC ........................... H03M 13/13; H03M 13/2909
USPC .................... 714/704, 785, 755, 758
See application file for complete search history.

(56) References Cited

U.S. PATENT DOCUMENTS

| 7,414,549 | B1* | 8/2008 | Yang et al. ...................... 341/50 |
| 7,653,867 | B2* | 1/2010 | Stankovic et al. ............. 714/785 |
| 8,073,052 | B1* | 12/2011 | Xu et al. ................... 375/240.03 |
| 8,207,874 | B2* | 6/2012 | Yang et al. ....................... 341/50 |
| 8,340,193 | B2* | 12/2012 | Lu et al. .................... 375/240.19 |
| 2008/0069242 | A1 | 3/2008 | Xu et al. |
| 2009/0003452 | A1 | 1/2009 | Au et al. |
| 2010/0166057 | A1* | 7/2010 | Huchet et al. ............ 375/240.01 |
| 2010/0177893 | A1 | 7/2010 | Jeon et al. |

FOREIGN PATENT DOCUMENTS

WO    WO 2012/072637    6/2012

OTHER PUBLICATIONS

Brites et al., *"Feedback Channel in Pixel Domain Wyner-Ziv Video Coding: Myths and Realities,"* European Signal Processing Conference (EUSIPCO 2006), Florence, Italy (Sep. 4-8, 2006).

(Continued)

*Primary Examiner* — Esaw Abraham
(74) *Attorney, Agent, or Firm* — Finnegan, Henderson, Farabow, Garrett & Dunner, L.L.P.

(57) ABSTRACT

This disclosure generally relates to encoding, transmission, and decoding of digital video, and more particularly to methods and systems for minimizing decoding delay in distributed video coding (DVC). In one embodiment, a video decoding method is disclosed. The video decoding method may include obtaining side information and obtaining a syndrome bit chunk corresponding to a non-key-frame bit-plane. One or more processors may perform one non-key-frame bit-plane channel decoding iteration using the side information and the syndrome bit chunk. A decoded bit-plane may be generated via performing the at least one non-key-frame bit-plane channel decoding iteration. Also, a bit error rate measure for the decoded bit-plane may be determined. A number of additional syndrome bit chunks to request may be determined based on the bit error rate measure, and the request for the additional syndrome bit chunks provided.

24 Claims, 15 Drawing Sheets

(56) References Cited

OTHER PUBLICATIONS

Rehman et al., *"Addressing the uncertainty in critical rate estimation for pixel-domain Wyner-Ziv video coding,"* SPIE conference on Visual Communications and Image Processing (VCIP), Huang Shan, China (Jul. 11-14, 2010).

Borchert, *"Distributed Video Coding (DVC): Motion estimation and DCT quantization in low complexity video compression,"* Doctoral Dissertation, Technical University of Delft, The Netherlands (Jun. 30, 2010).

* cited by examiner

Syndrome bit rate versus decoding time example in disclosed method in case of $t_d * l > t_t$ Syndrome bit rate versus decoding time example in disclosed method in case of $t_d * l < t_t$

METHODS AND SYSTEMS FOR MINIMIZING DECODING DELAY IN DISTRIBUTED VIDEO CODING

PRIORITY CLAIM

This disclosure claims priority under 35 U.S.C. §119 to: India Application No. 4543/CHE/2012, filed Oct. 31, 2012, and entitled "METHOD AND SYSTEM FOR MINIMIZING DECODING DELAY IN DISTRIBUTED VIDEO CODING." The aforementioned application is incorporated herein by reference in its entirety.

TECHNICAL FIELD

This disclosure generally relates to encoding, transmission, and decoding of digital video, and more particularly to methods and systems for minimizing decoding delay in distributed video coding (DVC).

BACKGROUND

The Distributed Video Coding (DVC) is a new video coding technique for emerging applications and services, such as low power wireless communication sensor networks, mobile video, video on demand, mobile phone TV, wireless video surveillance cameras, and mobile scanner among many diverse applications. The DVC is based on the encoding of selective frames and usage of techniques, such as interpolation/extrapolation methods, at the decoder end to restore remaining frames. In addition, an encoder of the DVC may send error-correction syndrome bits of the remaining frames, whereby the restored frames at the decoder maybe corrected for errors using syndrome bits. Further, the DVC may utilize a feedback channel, through which the decoder may request additional syndrome bits from the encoder incase decoding is not successful with already sent syndrome bits. The channel decoding operation may therefore be iterative and repeated for every additional syndrome bit received from the encoder. In addition, the decoder may sequentially request an additional syndrome bit chunk one at a time, if decoding fails with available syndrome bits.

Failure of decoding with available syndrome bits may lead to unacceptable rendering of relayed content because of increased buffering due to excessive iteration delays in iterative channel decoding operation of the DVC decoder and excessive round-trip delays through the feedback channel. These excessive iterative channel-decoding delays and excessive round-trip delays between the decoder request and availability of requested syndrome bit chunk at the decoder may prevent usage of DVC for real time applications

SUMMARY

In one embodiment, a video decoding method is disclosed, comprising: obtaining side information; obtaining a syndrome bit chunk corresponding to a non-key-frame bit-plane; performing, via one or more processors, at least one non-key-frame bit-plane channel decoding iteration using the side information and the syndrome bit chunk; generating a decoded bit-plane via performing the at least one non-key-frame bit-plane channel decoding iteration; determining a bit error rate measure for the decoded bit-plane; determining, based on the bit error rate measure, a number of additional syndrome bit chunks to request; and providing a request for the additional syndrome bit chunks.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments of the invention and, together with the description, serve to explain the principles of the invention.

DETAILED DESCRIPTION

Exemplary embodiments of the invention are described with reference to the accompanying drawings. Wherever possible, the same reference numbers are used throughout the drawings to refer to the same or like parts. While exemplary embodiments and features of the invention are described herein, modifications, adaptations, and other implementations are possible without departing from the spirit and scope of the invention. Accordingly, the following detailed description does not limit the invention. Instead, the proper scope of the invention is defined by the appended claims.

Embodiments of the invention relate to systems and methods for minimizing decoding delay in Distributed Video Coding (DVC) and transmission. The decoding system may minimize iterative channel decoding delays and/or round-trip delays associated with the decoding operation of DVC. In some embodiments, the contribution of iterative channel decoding delays may be minimized by using adaptive, multiple-syndrome chunks requests, as a function of the bit error rate of a decoded bit-plane and available channel bandwidth. Further, in some embodiments, the contribution of round-trip delays may be minimized by overlapping round-trip delays with channel decoding iterations delays, as a function of a reduction in bit error rate with iterations of decoded bit-plane and available channel bandwidth. For example, in some embodiments, a hamming distance may be used as measure of determining bit error rate among syndrome bits received from the encoder and decoded bit-planes.

Figure 1:
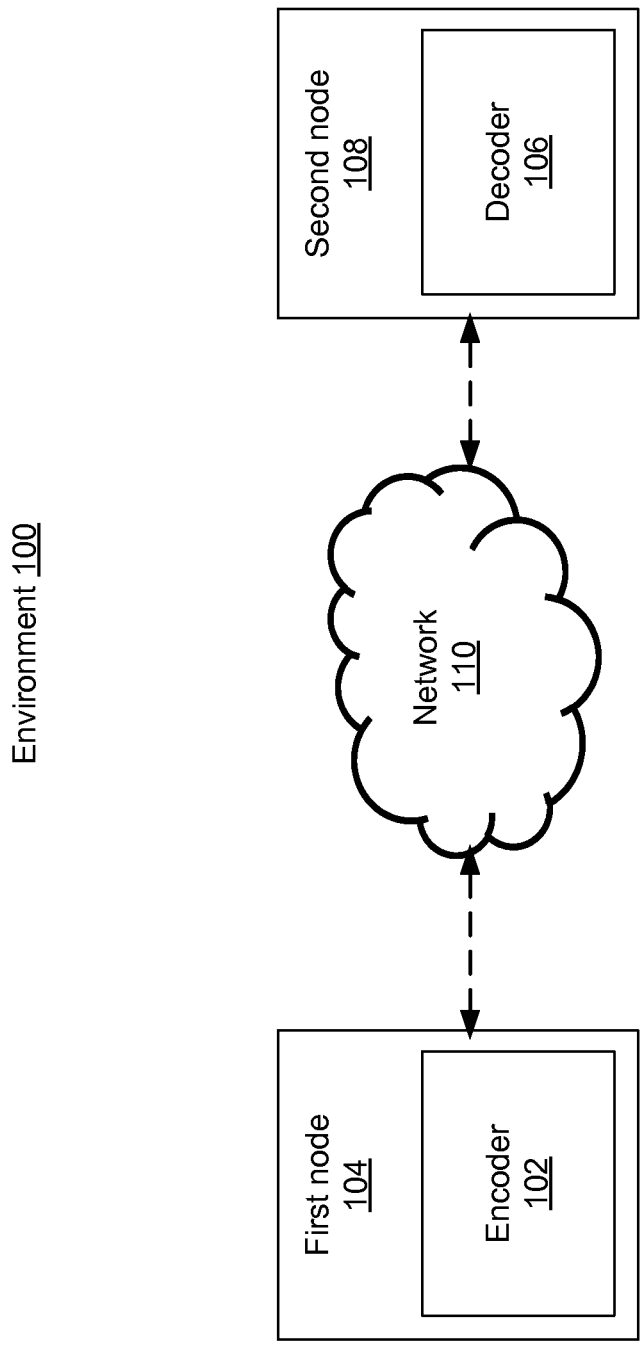
FIG. 1 illustrates an exemplary environment, where various embodiments of the invention may function.

FIG. 1 illustrates an exemplary environment 100, where various embodiments of the invention may function. The environment 100 may include an encoder 102 present at a first node 104 and a decoder 106 present at a second node 108. The first node 104 and the second node 108 may be any media processing device capable of recording, playing, and/or storing audio/video files or data. Examples of such devices include, without limitation, one or more smart phones, tablet computers, laptop computers, notebooks, portable gaming devices, or any other mobile device. Other examples of such devices include, without limitation, one or more gaming consoles, desktop computers, server systems, and the like. In some embodiments, the encoder 102 and/or decoder 106 may be embedded within their respective nodes. In alternate embodiments, however, both the encoder 102 and decoder 106 may not be part of the first node 104 and second node 108, respectively, but separate from the nodes. The first node 104 and the second node 108 may communicate and otherwise transmit or receive audio/video data with each other and/or other devices over a network 110. Although the environment 100 shows only a single first node 104 and a single second node 108, a person skilled in the art would appreciate that the environment 100 may include multiple first nodes 104 and second nodes 108. Similarly, the environment 100 may include multiple encoders 102 and decoders 106.

In some embodiments, the encoder 102 may be configured to encode video using distributed video coding techniques. The encoder 102 may be implemented as hardware, software, firmware, or combinations of these implementations. As an example, the encoder may be designed as a dedicated video-processing chip operatively connected to a computing device such as a desktop computer, laptop computer, tablet, smart phone, or mobile device. As another example, the encoder may be designed as a software application (e.g., that can be purchased and/or downloaded from a website or online store) that may be executed by a general-purpose computing processor. For example, the application may be a .exe file, a mobile app, a shared object (e.g., a Dynamic Link Library (DLL)), etc. Embodiments of the present disclosure may further be embodied in the form of a computer program product storing a software application comprising computer program code containing instructions embodied in tangible media, such as floppy diskettes, CD-ROMs, hard drives, USB (universal serial bus) drives, or any other machine readable storage medium, wherein, when the software application is loaded into and executed by a computing device, the computing devices becomes an apparatus for practicing disclosed embodiments.

The encoder 102 may be used for DVC in various emerging applications and services including, among others, low power wireless communication sensor networks, video on demand, mobile phone TV, and wireless video surveillance cameras. The encoder 102 may be configured to encode selective frames of a data stream. The encoder 102 may be further configured to send the encoded stream or frames along with one or more error-correction syndrome bits of the remaining frames to the second node 108 or the decoder 106.

The decoder 106 may be configured to decode the encoded data stream including one or more frames received from the first node 104. For example, the decoder may utilize distributed video coding-based decoding techniques to decode video frames from the data provided by the encoder. As in the case of the encoder, the decoder may be implemented as hardware, software, firmware, or combinations thereof.

The decoder 106 may use interpolation/extrapolation methods to restore the non-key frames of the data stream. In some embodiments, the decoder 106 may utilize syndrome bit chunks provided by the encoder 102 to restore the non-key frames. For example, the decoder 106 may be configured to obtain a syndrome bit chunk of a non-key-frame bit-plane. A bit-plane may be defined as a set of bits corresponding to a given bit position (e.g., least significant, most significant, etc.) in a binary number that may represent a pixel value, or a pixel component value (e.g., R, G, or B value for a pixel represented in the RGB color space)), or some other value (e.g., a coefficient), in a video frame. A syndrome bit chunk may be defined as a subset of a bit-plane, or combinations of subsets of different bit-planes. In some embodiments, the syndrome bit chunk may be obtained from a mobile electronic device including an encoder. The decoder 106 may perform at least one non-key-frame bit-plane channel decoding iteration using the syndrome bit chunk. The decoder 106 may also be configured to generate a decoded bit-plane via performing at least one non-key-frame bit-plane channel decoding iteration.

In some embodiments, the decoder may calculate a bit error rate measure for the decoded bit-plane. The bit error rate measure for the decoded bit-plane, in some embodiments, may be a hamming distance (D) between the decoded bit-plane and the syndrome bit chunk obtained from the encoder 102. The decoder 106 may be configured to determine a number of additional syndrome bit chunks to request based on the calculated bit error rate measure. The decoder 106 may determine the number while, for example, processing the already-received syndrome bit chunks. In some embodiments, the decoder 106 may provide or send a syndrome bit chunk request to the encoder 102 based on a determination of the number of additional syndrome bit chunks to request. In some embodiments, the decoder 106 may determine the number of additional syndrome bit chunks to request by calculating a hamming distance (D) after a (I-δ)th channel decoding iteration. 'I' may refer to any number of channel decoding iterations that may be performed using a single syndrome bit chunk, and 'δ' may refer to a predetermined number based on a round-trip delay associated with the underlying request.

Figure 2:
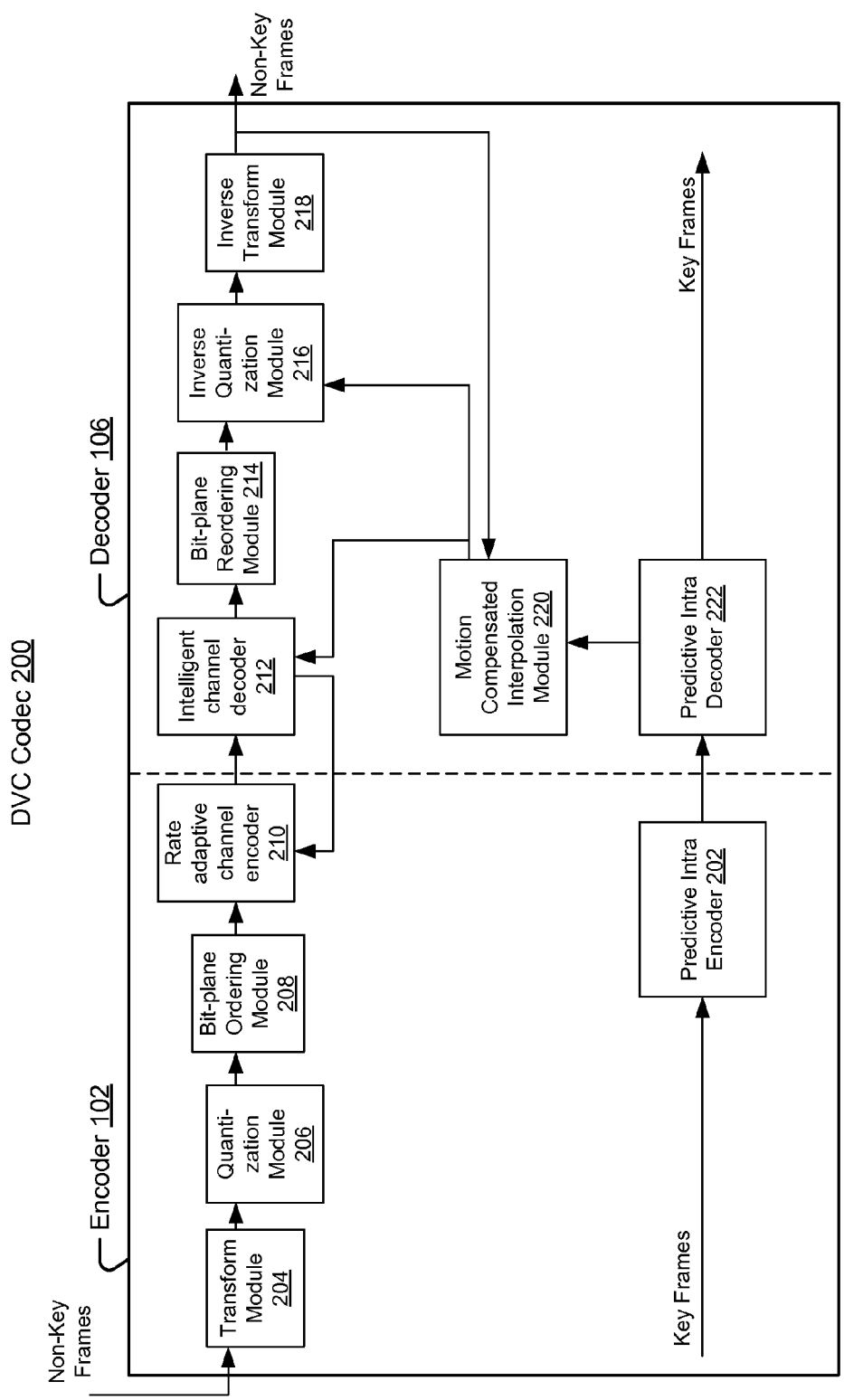
FIG. 2 illustrates a DVC Codec with encoder-decoder, in accordance with some embodiments of the invention.

FIG. 2 illustrates a DVC Codec 200, including an encoder 102 and a decoder 106, in accordance with some embodiments of the invention. In some embodiments, the data stream to be encoded may include one or more frames. For example, the data stream may represent a video stream. With respect to distributed video coding, there may be two categories of video frames that are decoded by the decoder—key frames and non-key frames. For example, in the data stream, a predetermined number of frames may be referred to as key-frames and the other, intermediate, frames between a set of key frames may be referred to as non-key frames. In some embodiments, a key frame may be defined as a frame in a video that defines a starting and/or ending point of a smooth transition. For example, the beginning and end frames of an act or scene in a movie may be considered key frames. It is, however, to be understood that the choice of key frame is not limited to such, and it is contemplated that any methodology may be used for choosing key frames (e.g., random selection). In some embodiments, non-key frames may be defined as those frames that are not considered key frames. Alternatively, the non-key frames may be chosen by a methodology, and the key frames may be considered those not chosen in that methodology. In some embodiments, the encoder may provide key frames to the decoder after encoding using purely intra-frame encoding techniques. In some embodiments, such intra-frame encoding may include Discrete Cosine Transform as part of the procedure. For example, as shown, the encoder 102 may employ a predictive intra encoder 202 to encode the key frames of the data stream using predictive video encoding methods. Examples of predictive video encoding methods include, but are not limited to, H.264, MPEG2, DivX, VC1, and compatible standards and configurations. It is contemplated that any purely intra-frame coding technique may be employed here.

For the non-key frames, however, the encoder may provide only a few bits that embody only a small portion of the information from the non-key frames to the decoder. In some embodiments, the encoder 102 may encode the non-key frames using a subset of transformation techniques including, but not limited to, transformation (see transform module 204), quantization (see quantization module 206), bit-plane ordering (see bit-plane ordering module 208), and/or rate adaptive channel encoding (see rate adaptive channel encoder 210). Examples of transformations include, but are not limited to, Discrete Cosine Transform (DCT), Discrete Wavelet Transform (DWT), sub-band transforms, or the like. It is contemplated that any compression or energy compaction technique may be utilized for the transformation performed by the transform module (204). The rate adaptive channel encoding utilized by the rate adaptive channel encoder (210) may be performed as part of Wyner-Ziv (WZ) encoding, which may include a low-density parity check (LDPC). For example, the WZ encoding may be performed by the collective action of modules 204, 206, 208 and 210. Bit-plane ordering by the bit-plane ordering module (208) may result in the generation of one or more bit-planes. The rate adaptive channel encoder 210 may encode each of the bit-planes separately. The encoder 102 may send one or more error-correction syndrome bits to the decoder 106, e.g., to an intelligent channel decoder 212 included in the decoder 106. In some embodiments, the encoder 102 may send error-correction syndrome bits to the decoder 106 in multiple chunks and upon request. A more detailed explanation follows of an exemplary method for processing of non-key frames by the encoder 102 in some embodiments.

In an exemplary scenario, assume a frame resolution of video being coded is P×L, where 'P' may define the number of pixels per line and 'L' may define the number of lines per frame. In addition, consider a transform block size in non-key frames as M×N, where 'M' may define the number of pixels and 'N' may define the number of lines in a block. Accordingly, the number of blocks in each frame may be calculated as (P×L)/(M×N). In some embodiments, the encoder 102 may separately transform and quantize each M×N block. Further, the quantized symbols of the same location in each block of the entire frame may be grouped together to form M×N bands. And each band length may be calculated as (P×L)/(M×N) quantized symbols. Moreover, bit-planes may be formed by grouping single bits from each quantized symbol of a band of the same significance (e.g., all most significant bits may be grouped together to form a bit-plane). Accordingly, the bit-plane length may be calculated as (P×L)/(M×N) bits. In some embodiments, the number of bit-planes per frame—i.e., 'B'—may depend on the quantization levels used. In some embodiments, the rate adaptive channel encoder 210 may encode each bit-plane separately. The number of error correction syndrome bits formed per bit-plane may thus be up to (P×L)/(M×N) bits. Rate adaptability may be achieved by dividing the formed error correction codes into smaller chunks. And, when there are 'R' syndrome bit rates (bit chunks/bit-plane) to achieve, each chunk size may be (P×L)/(M×N×R) bits. The encoder 102 may send one chunk of syndrome bits per bit-plane to the decoder 106 initially, with which the encoder 102 may try to decode one bit-plane at a time. Moreover, in some embodiments, the encoder 102 may not send any other information of the non-key frames. For example, for the Quarter Common Intermediate Format (QCIF) resolution of 176×144 with 4×4 transform block size, the bit-plane length is 1584 bits. In addition, if syndrome bit rates desired is 66, then each chunk of syndrome bits may be 24 bits.

Thus, in some embodiments, the encoder 102 may be configured to obtain a distributed video coding non-key frame for encoding. The encoder 102 may be configured to perform distributed video encoding of the non-key frame and generate a number of syndrome bit chunk(s) via performing the distributed video encoding. The encoder 102 may further be configured to receive a dynamic multiple syndrome bit chunks request from the intelligent channel decoder 212. The encoder 102 may be further configured to provide a subset of the syndrome bit chunks generated by the rate adaptive channel encoder 210 after receiving the dynamic multiple syndrome bit chunks request from the intelligent channel decoder 212. In some embodiments, the syndrome bit chunks may be generated by the encoder 102 by utilizing an adaptive channel encoding technique such as, but not limited to, Wyner-Ziv (WZ) encoding. Further, the adaptive channel encoding may generate low-density parity check codes. In some embodiments, the low-density parity check code may encode bit-planes separately. The encoder 102 may also be configured to provide key frame data for side information generation towards channel decoding.

In some embodiments, the key-frames may be decoded at the decoder 106 using the standard predictive intra decoder 222. The predictive intra decoder 222 may decode by using any suitable predictive video decoding method such as, but not limited to, H.264, MPEG2, DivX, VC1, etc. Further, side information may be predicted at the decoder 106 using decoded key-frames and previously decoded non-key frames, if any, via motion compensated interpolation module (220). The soft input probability values (also known as apriori probability) may be calculated from the side information used in soft decision channel decoding of non-key frames. In some embodiments, the intelligent channel decoder 212 may calculate the apriori probability. In some embodiments, the intelligent channel decoder 212 may decode one bit-plane at a time using soft input probability values and syndrome bits received from the encoder 210. In some embodiments, the channel decoding process may be based on an iterative belief propagation algorithm with 'I' iterations for each syndrome bit chunk of each bit-plane. After each iteration, the intelligent channel decoder 212 may recalculate probabilities, which are called a posteriori probabilities.

In some embodiments, the decoder 106 may restore the non-key frames using interpolation/extrapolation methods based on the error-correction syndrome bits provided by the encoder and the predicted side information. The decoder 106 may include an intelligent channel decoder 212 that may decode the encoded frames. After a successful decoding of all the bit-planes of a frame by the decoder 212, the bit-plane reordering (e.g., by bit-plane reordering module 214), inverse quantization (e.g., by inverse quantization module 216), and inverse transform (e.g., by inverse transform module 218) may be performed to generate the non-key frames. A more detailed explanation follows of an exemplary process for the iterative decoding of non-key frames by the decoder 106 in some embodiments.

Figure 3:
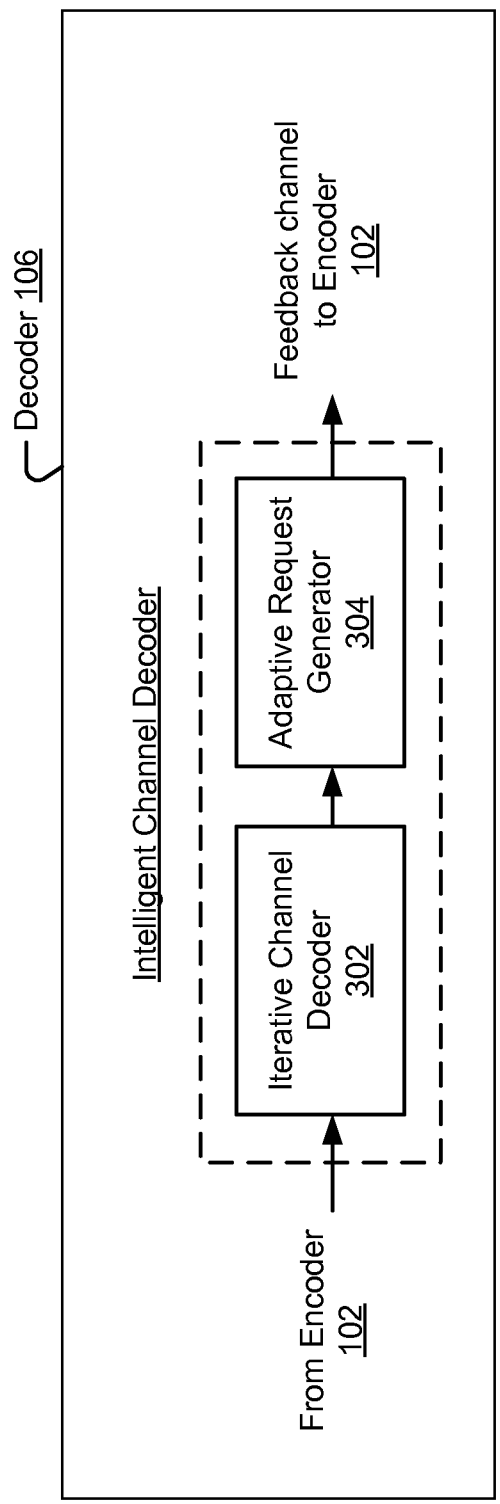
FIG. 3 illustrates an intelligent channel decoder, in accordance with some embodiments of the invention.

FIG. 3 illustrates an intelligent channel decoder, in accordance with some embodiments of the invention. In some embodiments, the decoder 106 may include an iterative channel decoder 302 configured to decode encoded non-key frames received from the encoder 102 in multiple iterations. Further, the decoder 106 may include an adaptive request generator 304 configured to request multiple syndrome bit chunks from the encoder 102 via the feedback channel.

In some embodiments, the adaptive request generator 304 may minimize iterations delays by sending multiple-syndrome-bit-chunk requests, reducing the effective number of requests for same number of chunks. Thus, the number of channel decoding iterations may be reduced, which can result in a reduction of iteration delay. For example, there may be up to 'R' requests generated during the decoding of each bit-plane if the system only utilizes single chunk requests (i.e., if the decoder only requests 1 new bit chunk per request for each of the R bit chunks per bit-plane). This may occur if the decoder needs all R bit chunks associated with a bit plane in order to successfully decode it. However, the theoretical maximum number of requests reduces to 'R/k', where 0<(1/k)<1 with multiple chunks requests that for example, request k bit chunks per request, where k>1, instead of only 1 bit chunk per request. The number of syndrome bit chunks to be requested in a single request may be decided based on the hamming distance with a predetermined lookup table.

The adaptive request generator 304 may also minimize effect of round-trip delays by overlapping round-trip delays with iterations delays. Therefore, the request for additional syndrome bit chunks may be sent without waiting for all 'I' iterations of each bit-plane decoding for a given set of syndrome bit chunks to occur. For example, the decoder 106 may send a request for additional syndrome bit chunks through the feedback channel after only a few iterations. In some embodiments, the request for additional bit chunks may be sent after 'I-δ' iterations completion, where 0<δ<I. If $t_d*I>t_t$, the value of 'δ' may calculated as $δ=(t_t/t_d)$. Here, $t_d$ is the decoding delay of each iteration of channel decoding of a bit-plane with a syndrome bit chunk, I is the number of channel decoding iterations that the intelligent channel decoder may perform with a single syndrome bit chunk, and $t_t$ is the a turn-around delay time to obtain the bit chunks requested from the encoder (e.g., a round-trip delay associated with sending a bit chunk request via a computer network such as the Internet). Calculating the value of δ in this manner may reflect the notion that, when the delay expected for performing all the channel decoding iterations possible with the available bit chunks is greater than the round trip delay, the decoder may delay the request for additional bit chunks from the encoder depending on a comparison of the decoding delay time to the turn-around delay time, such that any requested additional bit chunks still become available, despite delaying the timing of the request, at the decoder before all the channel decoding iterations possible with the available bit chunks have been completed On the other hand, if $t_d*I<t_t$, the 'δ' may be selected as high as possible—for example, as 'I-1' iterations. That is, when the delay expected for performing all the channel decoding iterations possible with the available bit chunks exceeds the round trip delay, the decoder may choose to request additional bit chunks from the encoder as early as possible in the process, so that the requested additional bit chunks become available at the decoder before (or not long after) all the channel decoding iterations possible with the available bit chunks have been completed. In some embodiments, whether to send a request for additional syndrome bit chunks at the completion of 'I-δ' iterations may be gated (e.g., the timing of the request may be controlled) by the reduction in hamming distance from iteration '1' to 'I-δ'. As an illustration, let us say hamming distance in the first iteration is 'd'. If the hamming distance after 'I-δ' iterations is greater than (δ/I)*d, then the decoder may transmit the request for additional syndrome bit chunks to the encoder 102 ahead of time (i.e., before completion of all the channel decoding iterations possible with the available bit chunks) through the feedback channel for use in subsequent decoding. This is because, if the hamming distance (d) is greater than (δ/I)*d, there is a high possibility that the hamming distance may not come down to '0' even after the completion of 'I' iterations. Therefore, in such a scenario, the request may be sent ahead of time in anticipation of the need for additional channel decoding iterations. But, if the hamming distance (d) is not substantial, there is a possibility that the hamming distance may come down to '0' upon 'I' iterations. Hence, in the latter case, the request for additional syndrome bits may be sent only if decoding fails after 'I' iterations.

If $t_d*I>t_t$, the decoding time per frame in the decoder 106 may be calculated or represented by the following equation:

$$t_{dec} = \sum_{i=1}^{B} \left( \frac{R'(i)}{k} * t_d * I \right)$$

Here, $t_{dec}$ is the total decoding delay per frame, $t_d$ is the decoding delay of each iteration of channel decoding of a bit-plane with a syndrome bit chunk, I is the number of channel decoding iterations that the intelligent channel decoder may perform with a single syndrome bit chunk, R'(i) is the number of syndrome bit chunks necessary to successfully decode the $i^{th}$ bit-plane, B is the total number of bit-planes per frame, and k is the number of syndrome bit chunks obtained in response to a single bit chunk request, which in some embodiments may vary as the decoder makes additional requests for bit chunks from the encoder. Also, $t_t$ is the a turn-around delay time to obtain the bit chunks requested from the encoder.

As given in the above equation, contribution of round-trip delays on decoding delay may be completely eliminated, because the variable $t_t$ does not appear anywhere in the equation. This can happen because the decoder may strategically make request(s) for additional syndrome bit chunks from the decoder while the decoder is still processing the available syndrome bit chunks, such that by the time the current decoding processes have been completed, the additional syndrome bit chunks are available at the decoder for further processing. Otherwise, contribution of iteration delays may reduce by a factor of 'k', where k is the number of syndrome bit chunks requested for in a single bit chunk request made by the decoder.

If $t_d*I<t_t$, the decoding time per frame by the decoder 106 may be calculated or represented by following equation:

$$t_{dec} = \sum_{i=1}^{B} \left( \left( \frac{R'(i)}{k} * t_d * I \right) + \left( \left( \frac{R'(i)-1}{k} \right) * (t_t - t_d * I) \right) \right)$$

This equations reflects the reduction in overall processing time because of maximal overlapping turn-around delays and decoding delays. See the "$(t_t-t_d*I)$" term. If there were no overlapping time whatsoever, and only one syndrome bit chunk were requested for in a single bit chunk request, that term would change to only "$t_t$," and the equation would look as follows:

$$I_{dec} = \sum_{i=1}^{B} ((R'(i) * t_d * I) + ((R'(i) - 1) * t_t))$$

It is to be understood that, although the equations above show the effect of maximal overlapping between the turn-around delay time and decoding delay time, it is to be understood that the disclosure contemplates any partial amount of overlap between the turn-around delay time and the decoding delay time.

Figure 4:
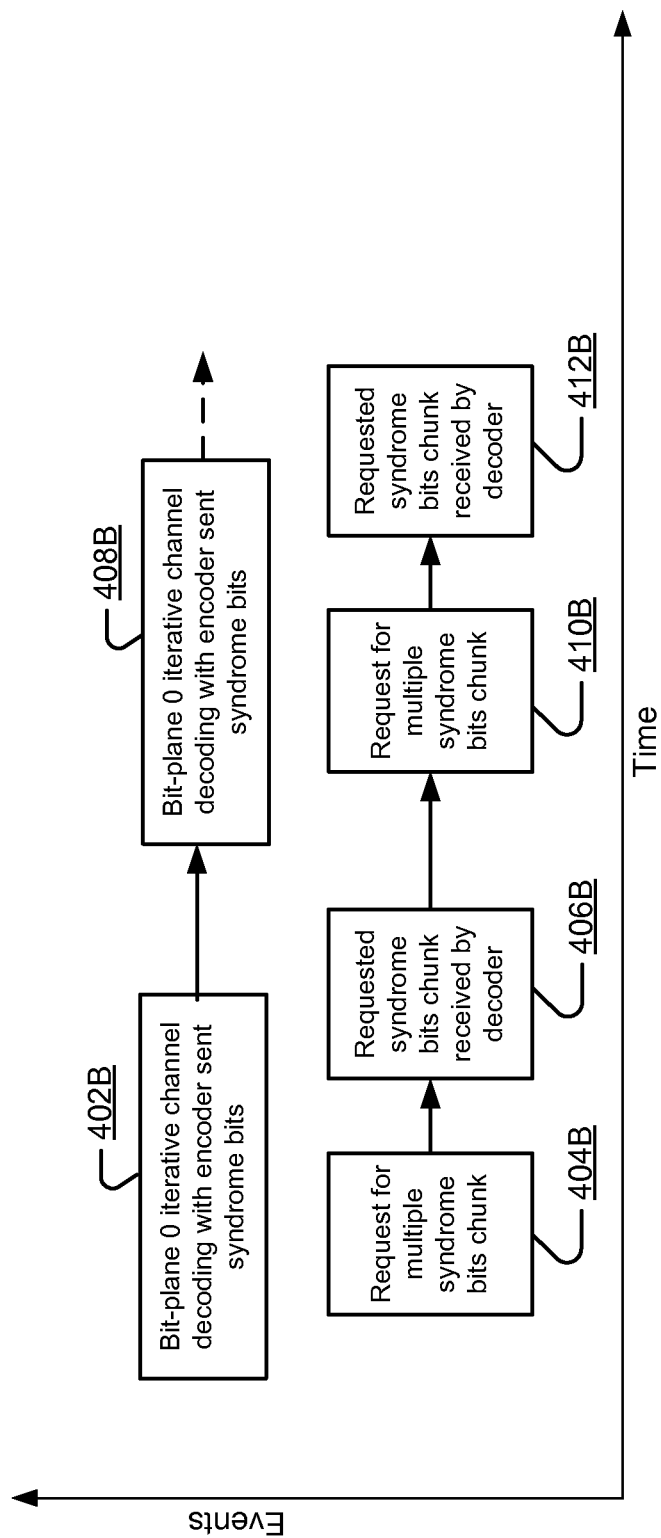
FIG. 4 illustrates a bit-plane decoding sequence, in accordance with some embodiments of the invention.

FIG. 4 illustrates a bit-plane decoding sequence in the decoder 212, in accordance with some embodiments of the invention. In the decoder 212, the number of chunks per request may be adaptive. Similarly, the iteration at which the requests may be sent may also be adaptive. This may result in minimized iterations delays and round-trip delays. The success of the decoder 212 may be verified using the hamming distance between the decoded bit-plane and received syndrome bits. When the hamming distance is '0', then it is considered to be a successful decoding of the current bit-plane. In some embodiments, bit-plane reordering, inverse quantization, and inverse transform may be performed after a successful decoding of all the bit-planes for a frame.

As depicted at step 402B of FIG. 4, the iterative channel decoder 302 may decode bit-plane 0 with syndrome bits sent by the encoder 102. At step 404, the adaptive request generator 304 may make a request for multiple syndrome bit chunks. Further requests for multiple syndrome bit chunks may be sent (e.g., step 404B, 410B) by the adaptive request generator 304 while the decoding is still happening (e.g., step 402B, 408B). At step 406B, the decoder 106 may receive the requested syndrome bit chunks. Steps 406B and 402B may happen during the same time frame. At step 408B, bit-plane 0 may iteratively decode the non-key frames using the syndrome bits received from the encoder 102. The adaptive request generator 304 may request multiple syndrome bit chunks at steps 410B, and at 412B, the decoder 106 may receive the requested syndrome bit chunks from the encoder 102. Steps 408B, 410B, and 412B may be executed during the same time frame, and even simultaneously, thereby minimizing delay.

Figure 5A:
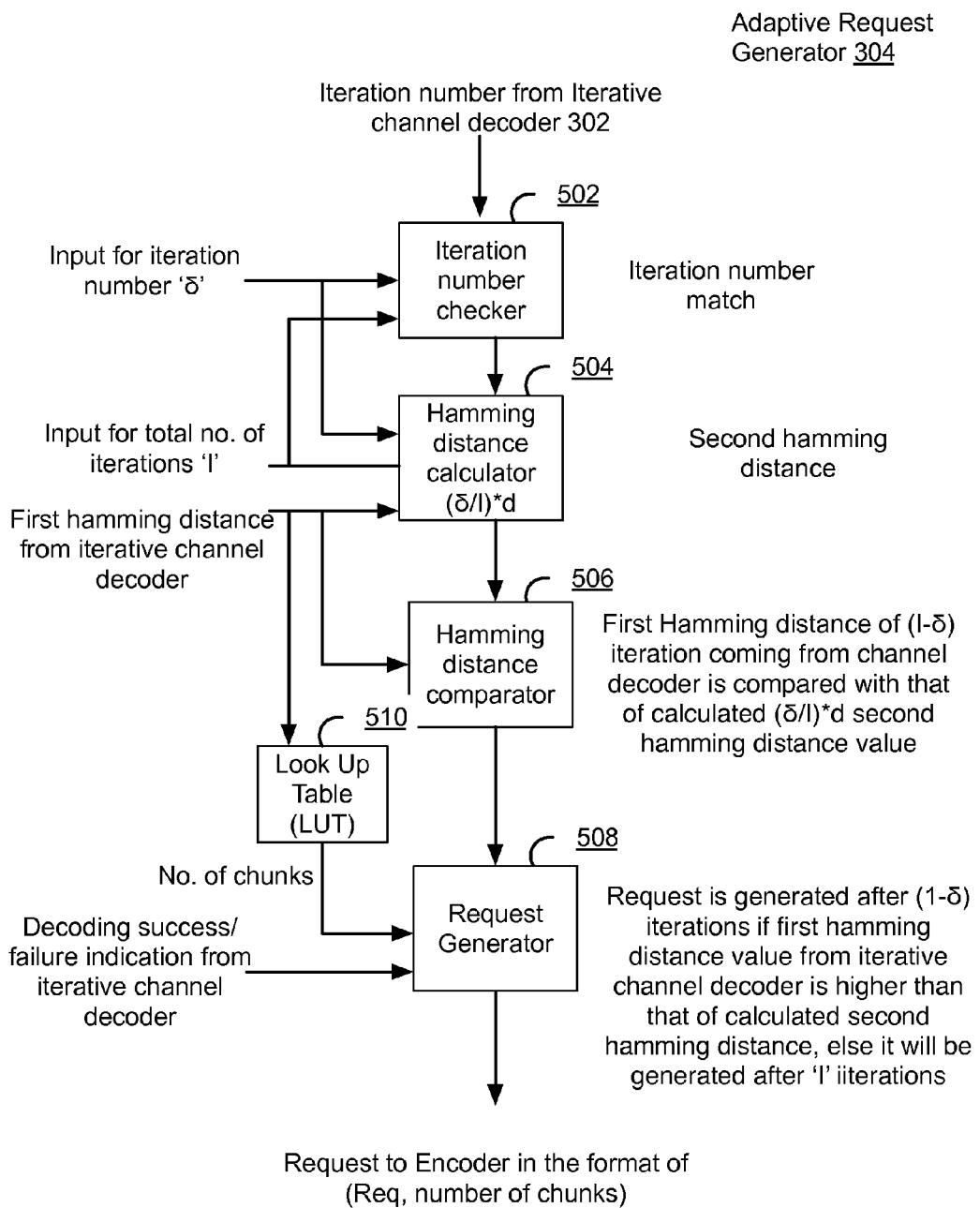
FIG. 5A illustrates exemplary components of an adaptive request generator of the bit-plane decoder, in accordance with some embodiments of the invention.

FIG. 5A illustrates exemplary components of the adaptive request generator 304 of the decoder 212, in accordance with some embodiments of the invention. The adaptive request generator 304 may include an iteration number checker 502, a hamming distance calculator 504, a hamming distance comparator 506, a request generator 508, and a Look up Table (LUT) 510.

The adaptive request generator 304 may receive a predetermined number of iterations 'δ' and total number of iterations 'I' as inputs, as well as an iteration number coming from the iterative channel decoder 302. The adaptive request generator 304 may further receive a hamming distance for every iteration of channel decoding, as well as a decoding success or failure indication, from iterative channel decoder 302. The iteration number checker 502 may also be configured to receive the current iteration number from the iterative channel decoder 302. Further, the iteration number checker 502 may be configured to receive the inputted predetermined number of iterations 'δ' and total number of iterations 'I'. The iteration number checker 502 may also be configured to compute a value for (I-δ) and compare it with the iteration number coming from the iterative channel decoder 302. When the comparison matches, the iteration number checker 502 may provide an indication of the match to the hamming distance calculator 504. The hamming distance calculator 504 may also receive the hamming distance of each iteration from the iterative channel decoder 302. The hamming distance calculator 504 may also receive the predetermined number of iterations 'δ' and total number of iterations 'I'. The hamming distance calculator 504 may further calculate a second hamming distance value (δ/I)*d when there is an iteration match indication from the iteration number checker 502. Here, 'd' is the first hamming distance of first iteration from the iterative channel decoder 302. This resultant value may be fed to the hamming distance comparator 506. The hamming distance comparator 506 may compare the first hamming distance of (I-δ) iteration coming from the iterative channel decoder 302 with that of the calculated second hamming distance in the hamming distance calculator 504. The hamming distance comparator 506 may find out which is greater and pass on that information to the request generator 508.

Also, there may be a Look up Table (or LUT) 510 capable of receiving the first hamming distance from the iterative channel decoder 302. The LUT 510 may output a 'number of chunks' per request to the request generator 508. The request generator 508 may also receive decoding success or failure information from the iterative channel decoder 302. The request generator 508 may generate a request for additional syndrome bit chunks through a feedback channel if decoding fails. When the first hamming distance of (I-δ) iteration received from the iterative channel decoder 302 is higher than the second hamming distance of (I-δ) iteration calculated by the hamming distance calculator, then the request generator 508 may generate a request for additional syndrome bits after (I-δ) iterations. And the request generator 508 may generate the request after 'I' iterations if first hamming distance of (I-δ) iteration coming from the iterative channel decoder 302 is lower than second hamming distance of (I-δ) iteration calculated in the hamming distance calculator 504. The request may be generated, for example, in the form: (req, number of chunks). The 'req' field may indicate that there is a request, and the 'number of chunks' field may indicate the number of chunks requested with this 'req'.

Figure 5B:
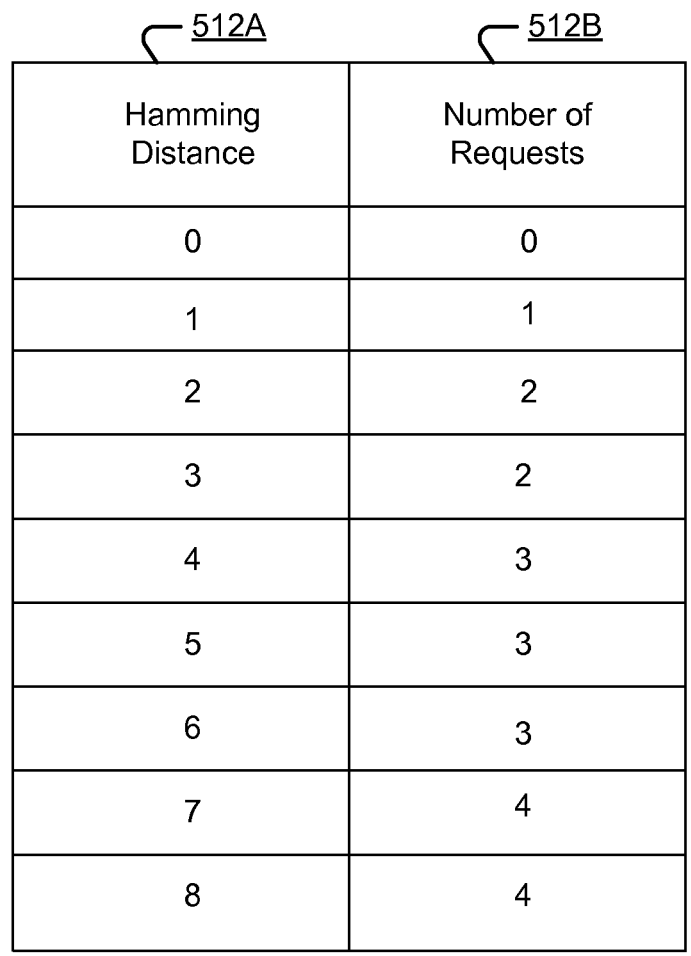
FIG. 5B illustrates an exemplary Look Up Table (LUT), in accordance with some embodiments of the invention.

An example format of LUT 510 is shown in FIG. 5B. The LUT 510 may include one or more columns such as columns 512A-B. The columns 512A-B may include hamming distances and number of requests corresponding to the hamming distances. Though not shown, but a person skilled in the art would appreciate that the LUT 510 may include more than two columns. The maximum hamming distance may be up to the number of bits used for representing pixel component. In addition, the maximum number of requests may be up to the syndrome bit chunks rate 'R'. For lookup table 510, the first hamming distance from the iterative channel decoder 302-depicted in column 512A—may be the address and output may be the number of chunks per request—depicted in column 512B. The number of chunks per request value may represent the number of syndrome bit chunks to be requested from the encoder 102 in the form "(req, number of chunks)" through the feedback channel.

Thus, in some embodiments, the number of syndrome bit chunks to request may vary dynamically with decoding progress. For example, a first request may include a request for a large number of bit chunks, whereas subsequent requests may include requests for fewer numbers of bit chunks as a hamming distance reduces with additional iterations of channel decoding. In some embodiments, the request generator 304 may determine the number of additional syndrome bit chunks to request by calculating a hamming distance (D) after a (I-δ)th channel decoding iteration. Here, 'I' may be any arbitrary number of channel decoding iterations that may be performed using a single syndrome bit chunk and 'δ' may be a predetermined number based on a round-trip delay associated with the request. In some embodiments, when the hamming distance (D) is greater than the value of (δ/I)*D, the request generator 304 may determine the number of additional syndrome bit chunks to request based on the hamming distance (D). In another embodiment, when the hamming distance (D) is less than or equal to the value of (δ/I)*D, the decoder 106 may calculate a hamming distance after 'I' number of channel decoding iterations that may be represented as 'DI'. Further, the decoder 106 may determine the number of additional syndrome bit chunks to request based on the hamming distance (DI). The use of hamming distance to determine the number of the number of syndrome bit chunks to request for in a single request may ensure that the number unnecessary bit chunks requested is minimized (i.e., few or none of the bit chunks requested are not needed to complete the decoding operation successfully). It is contemplated that any method of determining the minimum number of bit chunks necessary to successfully decode a bit-plane may be utilized instead of using the hamming distance with a lookup table.

Figure 6:
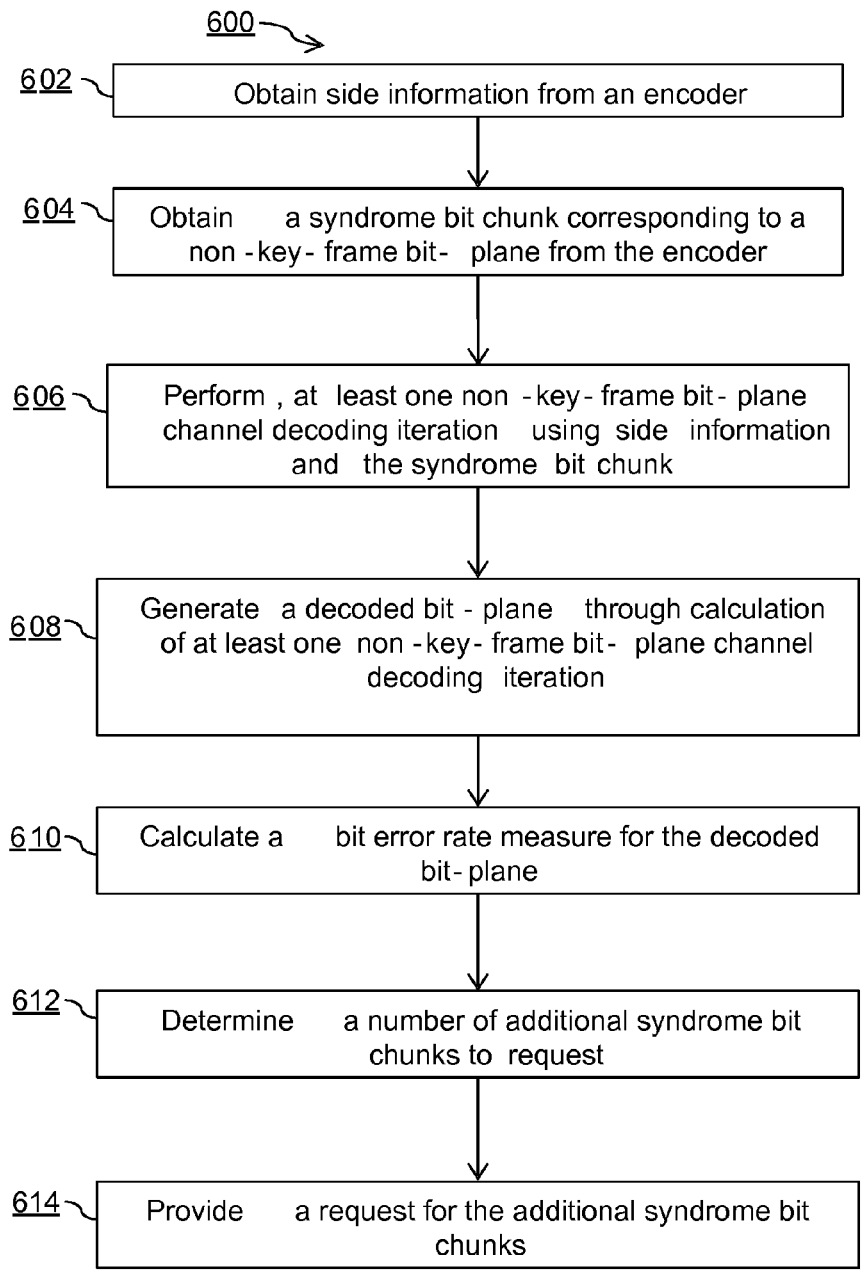
FIG. 6 is a flowchart illustrating a DVC decoding method, in accordance with some embodiments of the invention.
Figure 7A:
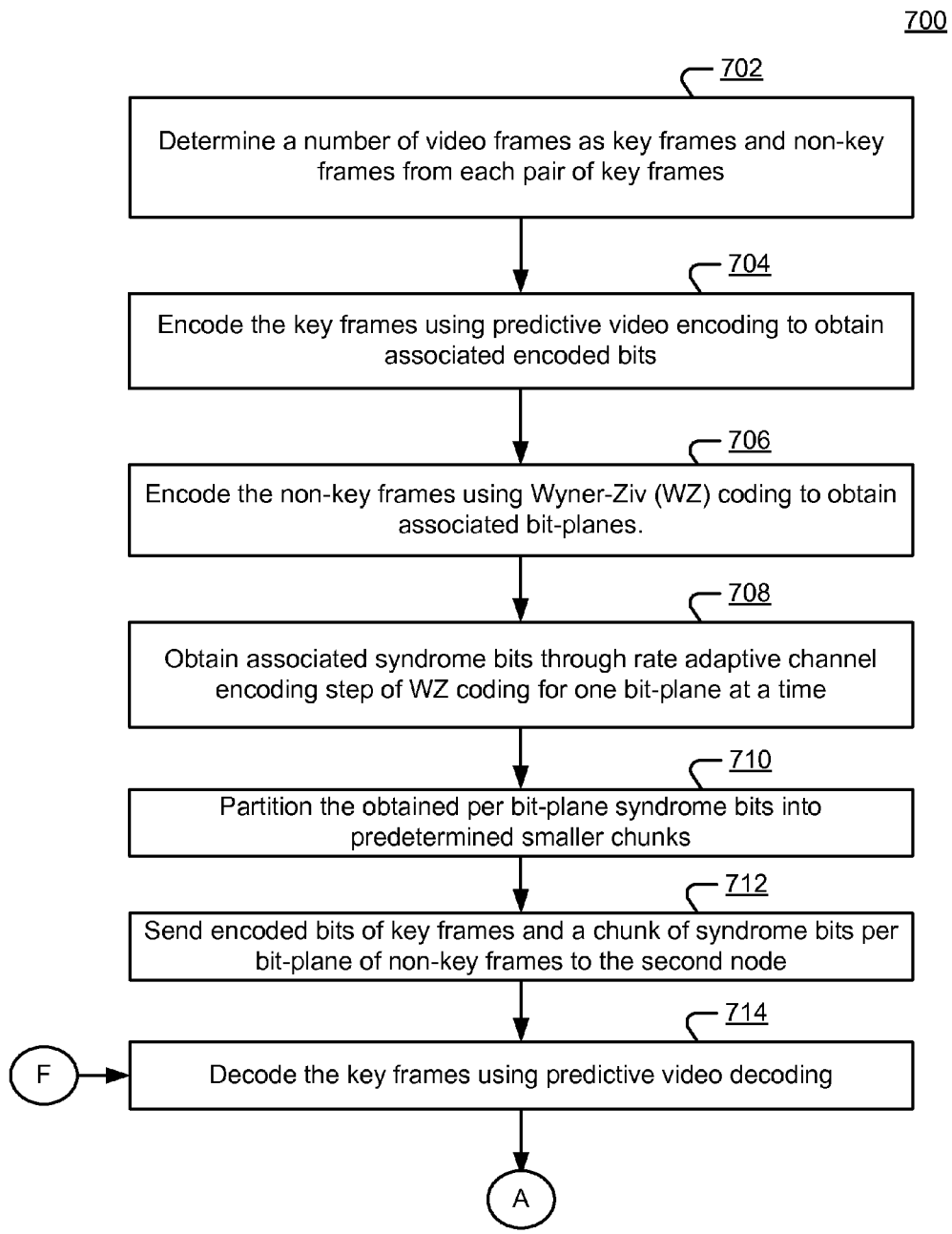
FIGS. 7A-7D is a flowchart illustrating various steps of distributed video encoding and decoding, in accordance with some embodiments of the invention.
Figure 7B:
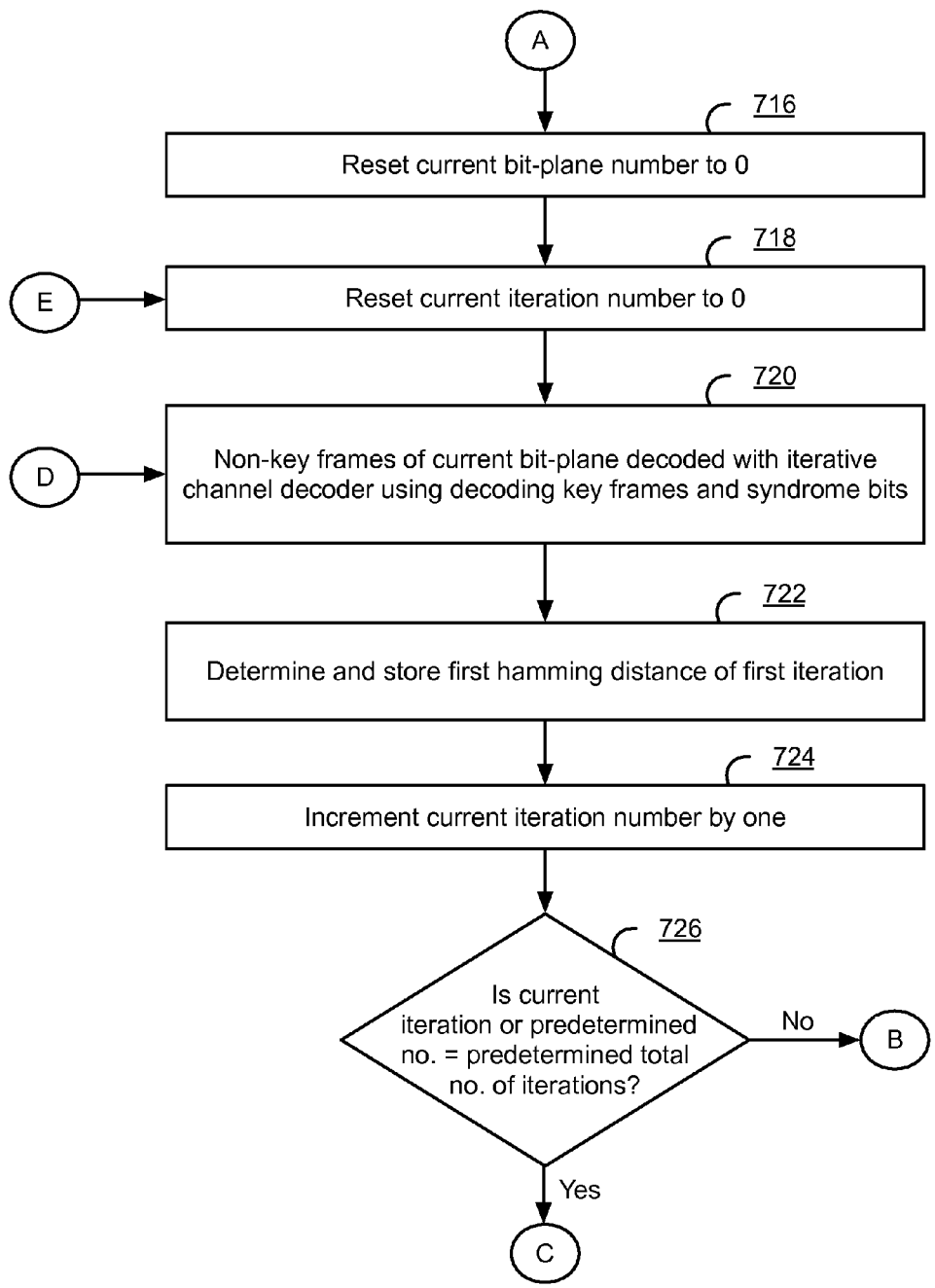
Figure 7C:
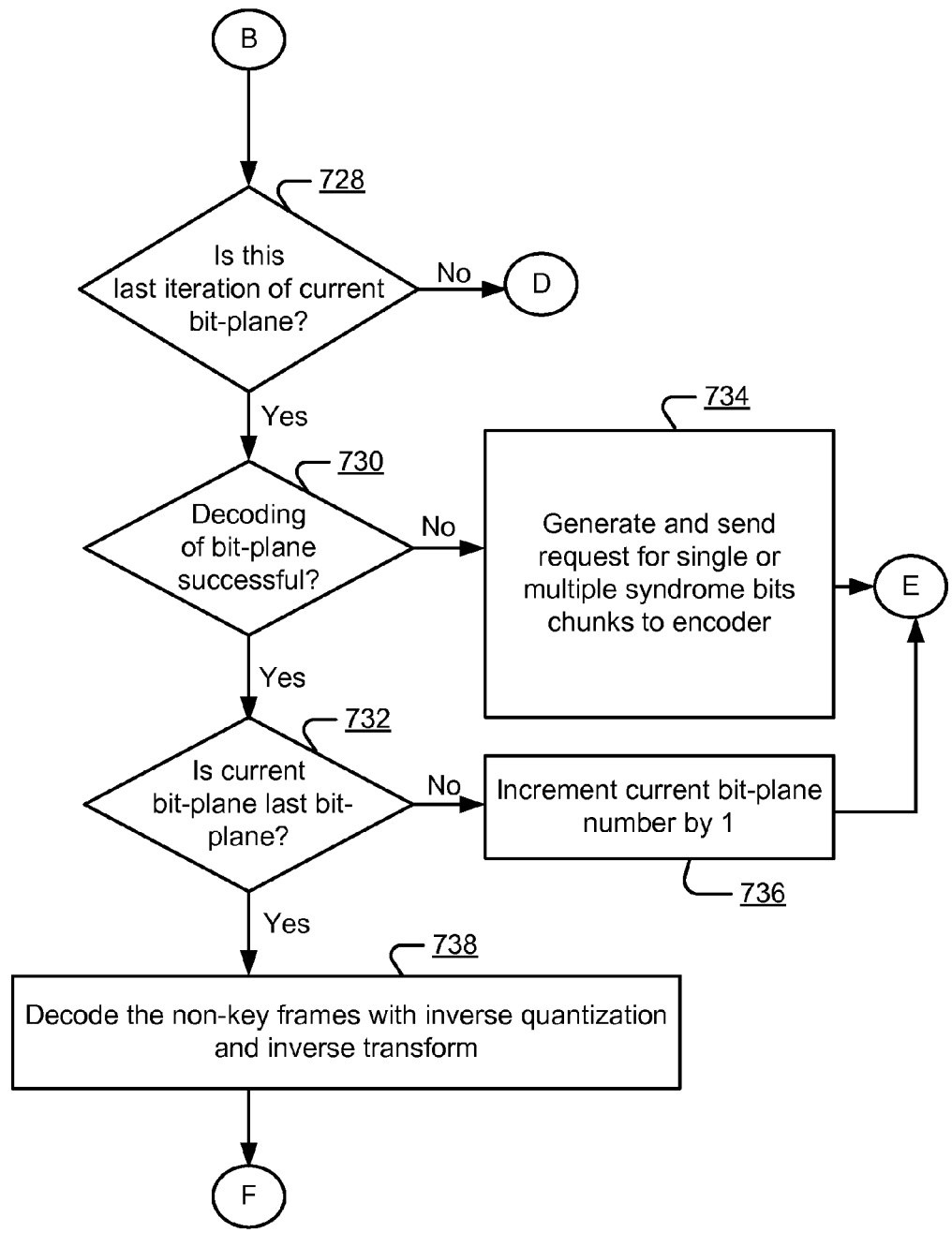
Figure 7D:
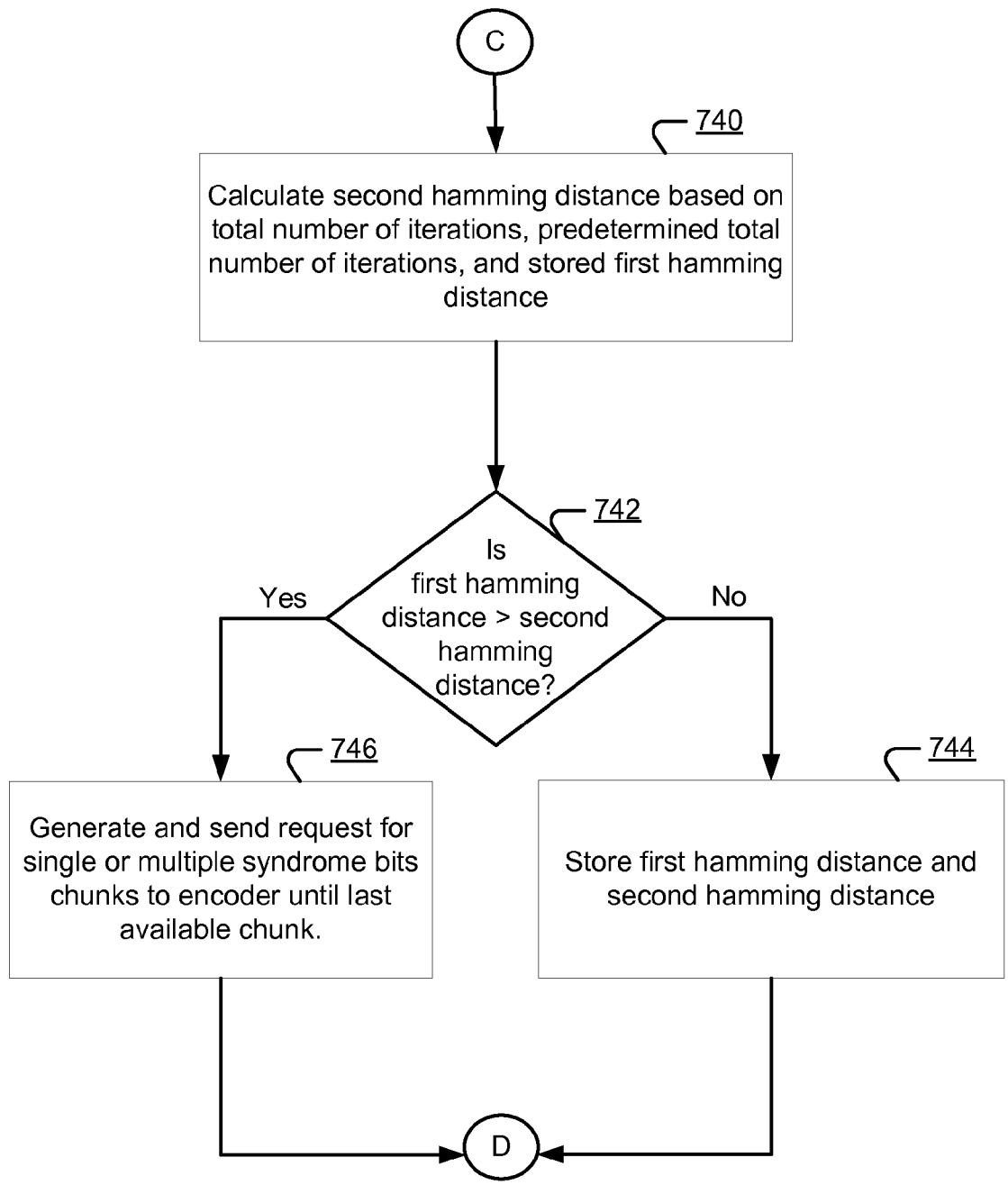

FIG. 6 is a flowchart illustrating an exemplary DVC decoding method, in accordance with some embodiments of the invention. As discussed with reference to FIGS. 1-4, the DVC codec 200 may include the encoder 102 and the decoder 106.

At step 602, the decoder 102 may calculate side information using key frame data obtained from the encoder 102. At step 604, a syndrome bit chunk corresponding to a non-key-frame bit-plane may be obtained. In some embodiments, the decoder 106 may obtain or receive the syndrome bit chunk from the encoder 102. At step 606, at least one non-key-frame bit-plane channel decoding iteration may be performed, via one or more processors, using the side information and the syndrome bit chunk. Then at step 608, a decoded bit-plane may be generated via performing the at least one non-key-frame bit-plane channel decoding iteration. At step 610, a bit error rate measure for the decoded bit-plane may be calculated. Then at step 612, a number of additional syndrome bit chunks to be requested may be determined based on the bit error rate measure. In some embodiments, the adaptive request generator 304 may determine the additional syndrome bit chunks to be requested from the encoder 102. Thereafter, at step 614, a request for the additional syndrome bit chunks may be provided. In some embodiments, the adaptive request generator 304 may send or provide the request for the additional syndrome bit chunks to the encoder 102.

FIGS. 7A-7D depict a flowchart illustrating various exemplary steps of distributed video encoding and decoding 700 using the encoder 102 and decoder 106, in accordance with some embodiments of the invention. At step 702, a predetermined number of video frames may be identified as key frames, and remaining video frames among each pair of key frames may be identified as non-key frames by the encoder 102. At step 704, the encoder 102 may encode the key frames using predictive video encoding to obtain associated encoded bits. In some embodiments, the predictive intra encoder 202 may encode the key-frames. Then at step 706, the non-key frames may be encoded using Wyner-Ziv (WZ) coding to obtain associated bit-planes. In some embodiments, the rate adaptive channel encoder 210 may encode the non-key frames by performing block based transform, quantization, and bit-plane ordering. Each bit-plane may have an associated bit-length, which may be a function of the frame-resolution and block-size on which the transform is applied. In some embodiments, the number of bit-planes per frame may be a function of transform block size and quantization levels.

In another embodiment, the number of syndrome bits in a chunk of bit-plane may be a function of the bit-plane length and number of syndrome bit rates desired. Thus, the number of syndrome bit rates may determine the number of syndrome bits in a chunk.

At step 708, the non-key frames may be encoded using the rate adaptive channel encoding step of WZ coding (step 706) to obtain syndrome bits. In some embodiments, the channel encoder may encode one bit-plane at a time. At step 710, the obtained per bit-plane syndrome bits may be partitioned into smaller chunks for rate adaptability. In some embodiments, the bit-plane syndrome bits may be partitioned into smaller chunks as a function of bit-plane length and number of syndrome bit rates desired. At step 712, encoded bits of key frames and a chunk of syndrome bits per bit-plane of non-key frames may be sent to the second node 108 or the decoder 106. At step 714, the key frames may be decoded using predictive video decoding such as H.264, MPEG 2/4, and similar compatible configurations. In some embodiments, the predictive intra decoder 222 may decode the encoded bits of the key frames. Further, at step 716, current bit-plane number may be reset to 0. Then at step 718, current iteration number is reset to zero.

At step 720, non-key frames may be decoded with the decoder 212 (based on a predetermined number of iterations) using decoded key frames and syndrome bits of non-key frames. Further, the decoder 212 may decode one bit-plane at a time. At step 722, a first hamming distance between decoded non-key frames and syndrome bits received from the encoder 102 may be calculated. The hamming distance of first iteration may be stored at the second node 108 or the decoder 106. At step 724, current iteration number may be incremented by one.

At step 726, it may be checked whether current iteration number is equal to the total number of predetermined iterations. If the current iteration is determined to be equal to the total number of predetermined iterations then step 740 is executed else step 728 is executed. At step 728, it may be checked whether the ongoing iteration is the last iteration of the current bit-plane. If yes then step 730 may be followed else flow loops back to step 720. At step 730, it may be checked whether current bit-plane decoded successfully. If the decoding of bit-plane is successful then further verification as whether the current bit-plane is the last bit-plane is performed at step 732.

If at step 730 decoding of the bit-plane is not successful then at step 734 a request for single or multiple syndrome bit chunks may be generated and sent to the encoder 102 based on the scenario that the stored first hamming distance is less than stored second hamming distance, and then control goes to step 718. In some embodiments, the criteria of determining number of syndrome bit chunks to request may be a function of first hamming distance.

If the currently decoded bit-plane is not the last bit-plane at step 732 the decoder may either increment current bit-plane count by one and loop back the flow control to step 718 or start decoding the non-key frames using at step 738 if the current bit-plane is found to be the last bit-plane. Thereafter, the program control may go back to step 714 and again start decoding fresh key frames.

At step 726, if the current iteration is not equal to the predetermined total number of iterations, then a second hamming distance may be calculated at step 740. In some embodiments, the second hamming distance may be calculated as a function of predetermined number lower than total number of iterations, predetermined total number of iterations, and stored first hamming distance of the first iteration. At step

742, it may be checked whether the first stored hamming distance is greater than the calculated second hamming distance. If the outcome of step 742 is not affirmative, then the first hamming distance and the second hamming distance may be stored at step 744. Control may then go to step 720. Otherwise, control may go to step 746, where a request for single or multiple syndrome bit chunks may be generated and sent to the encoder 102 until the last available chunk. The control may then pass on to step 720 to start the decoding of non-key frames through the iterative channel decoder. In some embodiments, the criteria of determining the number of syndrome bit chunks to request may be a function of the first hamming distance.

Further, the number of additional syndrome bit chunks requested may be based on the hamming distance (which is a measure of bit error rate, i.e., quality) of decoded bit-plane and available channel bandwidth. Furthermore, additional syndrome bit chunks may be requested while the current syndrome bit chunk(s) is still being processed. Therefore, the iterative channel decoding delay for processing the current syndrome bit chunk(s) may overlap with round trip delays associated with requesting the additional syndrome bit chunks from the encoder 102 via the DVC feedback channel. In addition, timing of the request may be determined based on a comparison of the iterative channel decoding delay and the feedback channel round trip delay.

It is to be understood that the distributed video encoding and decoding 700 process can begin at any particular step. Also, it is to be understood that the steps are not limited to being performed in the order described, but may be performed in any order, and that some steps may be omitted.

Figure 8A:
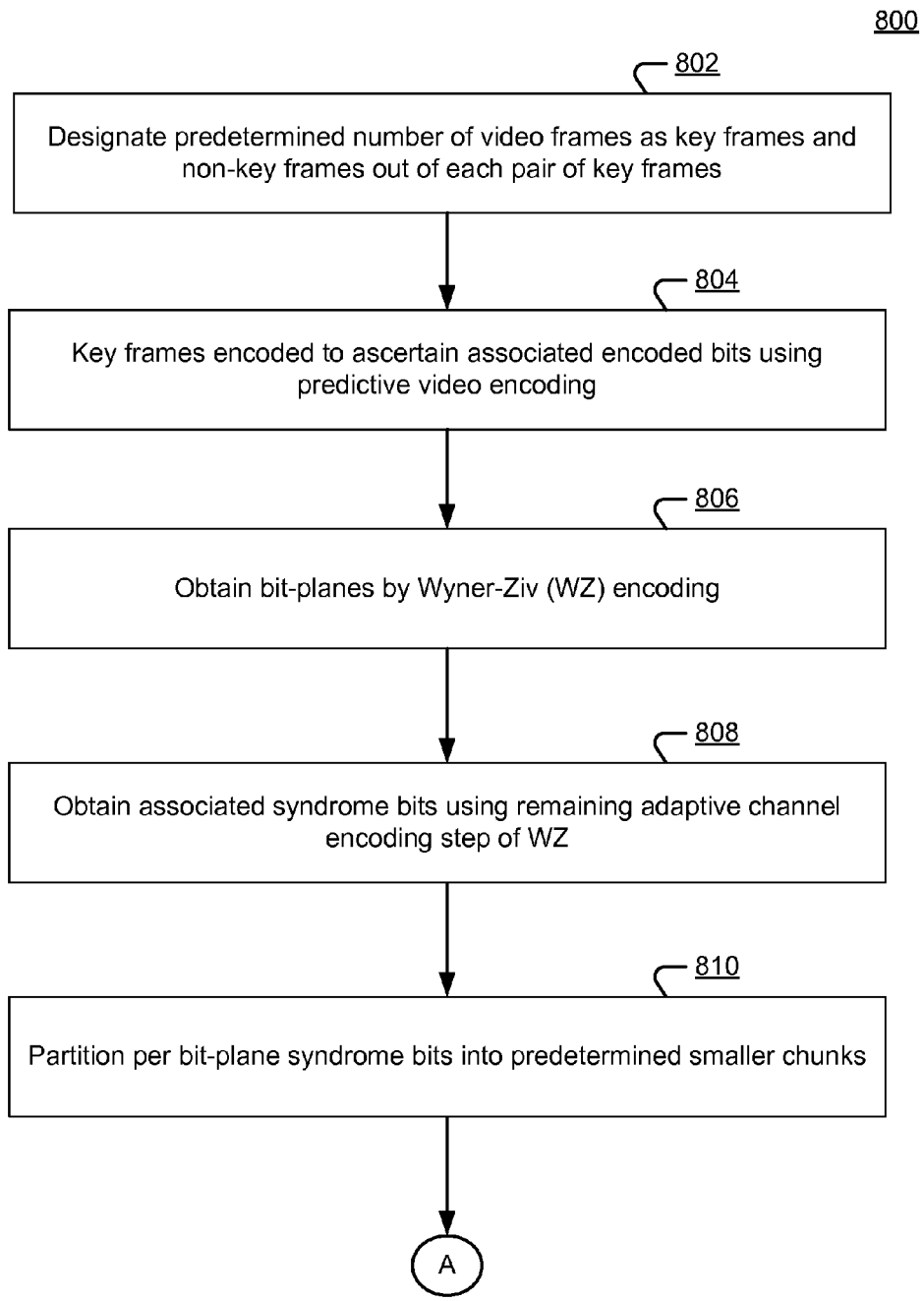
FIGS. 8A-8B is a flowchart illustrating various steps of DVC, in accordance with some embodiments of the invention.
Figure 8B:
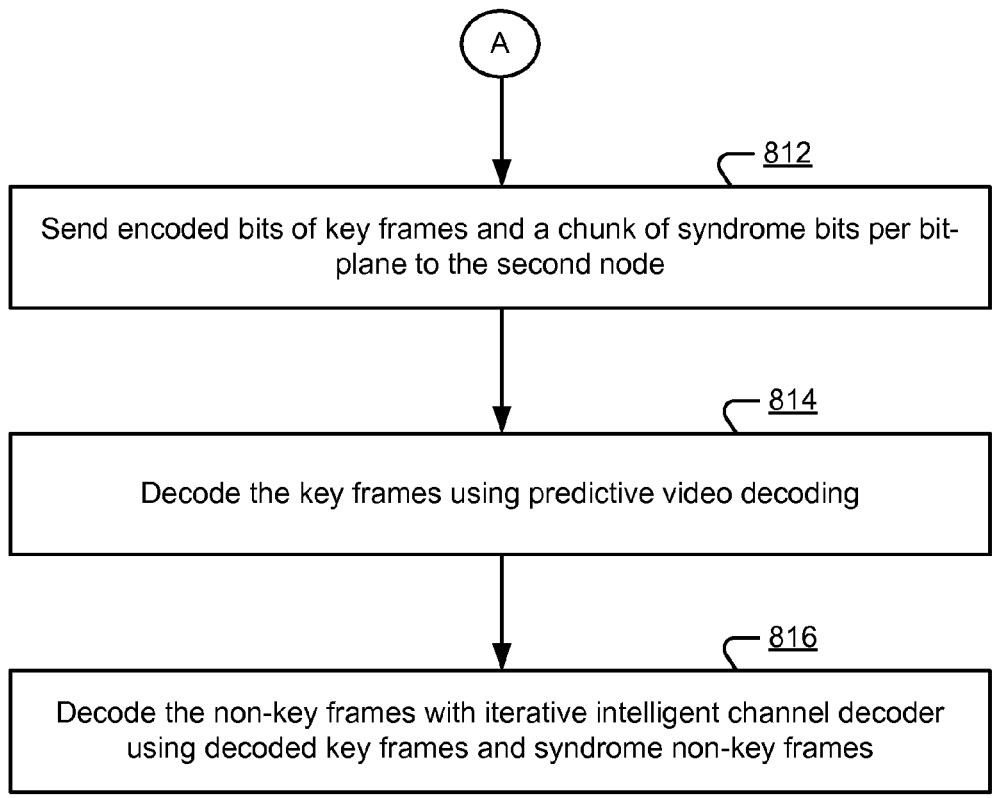

FIGS. 8A-8B depict a flowchart illustrating various steps of DVC 800 using the encoder 102 and the decoder 106, in accordance with some embodiments of the invention. At step 802, predetermined number of video frames may be declared as key frames, and the remaining video frames among each pair of key frames are declared as non-key frames. At step 804, the key frames may be encoded using predictive video encoding to obtain associated encoded bits. At step 806, the non-key frames may be encoded using WZ coding, including block based transform, quantization, and bit-plane ordering to obtain associated bit-planes. In some embodiments, the bit-plane length may be a function of frame resolution and block size of transform applied. Further, the number of bit-planes may be a function of transform block size and number of syndrome bit rates desired. At step 808, the remaining non-key frames may be encoded using the remaining rate adaptive channel-encoding step of WZ coding to obtain associated syndrome bits. In some embodiments, rate adaptive channel encoder 210 may encode the non-key frames.

At step 810, the obtained bit-plane syndrome bits may be partitioned into predetermined smaller chunks for rate adaptability. In some embodiments, the obtained bit-plane syndrome bits may be partitioned into predetermined smaller chunks as a function of bit—plane length and number of syndrome bit rates desired. Then at step 812, encoded bits of key frames and a chunk of syndrome bits per bit-plane of non-key frames may be sent to the second node 108. At step 814, the key frames may be decoded using predictive video decoding. Thereafter, at step 816, the non-key frames may be decoded with the decoder 106 with predetermined total number of iterations using decoded key frames and syndrome bits of non-key frames.

The decoder 106 may reduce the decoding delay as the decoder 106 can reduce the number of iterations by adaptively determining the number of syndrome bit chunks per request as a function of bit error rate of decoded bit-plane and available channel bandwidth. Further, the decoder 106 may reduce the effect of round trip delay by overlapping round trip delay with channel decoding iterations delay as a function of reduction in bit error rate with iterations of decoded bit-plane and available channel bandwidth. Accordingly, in some embodiments, decoder 106 may obtain a syndrome bit chunk of a non-key-frame bit-plane from the rate adaptive channel encoder 210. Then, using the iterative channel decoder 302, the decoder 106 may perform at least one non-key-frame bit plane channel decoding iteration using the syndrome bit chunk.

In some embodiments, the decoder 106 may generate a decoded bit-plane via performing the at least one non-key-frame bit-plane channel decoding iteration. The decoder 106 may calculate a bit error rate measure for the decoded bit-plane. The decoder 106 may determine a number of additional syndrome bit chunks to be requested based on the bit error rate measure. The decoder 106 may also provide a syndrome bit chunk request to the encoder based on determining the number of additional syndrome bit chunks to be requested.

In some embodiments, the decoder 106 may include one or more processors (not shown) and a memory (not shown) operatively connected to the one or more processors. The memory may store one or more instructions executable by the one or more processors for obtaining side information and obtaining a syndrome bit chunk corresponding to a non-key-frame bit-plane. The memory may also include instructions for performing, via the one or more processors, at least one non-key-frame bit-plane channel decoding iteration using the side information and the syndrome bit chunk. The memory may further include instruction(s) for generating a decoded bit-plane via performing the at least one non-key frame bit-plane channel decoding iteration. The memory may also include instruction(s) for calculating a bit error rate measure, which the decoder may use to determine a number of additional syndrome bit chunks to request. The memory may also include instruction(s) for providing a request for the additional syndrome bit chunks to the encoder 102.

In another embodiment, the decoder 106 may also calculate a bit error rate measure for the decoded bit-plane and determine a number of additional syndrome bit chunks to request based on the bit error rate measure. Further, the decoder 106 may be configured to provide a syndrome bit chunk request based on a determination of the number of additional syndrome bit chunks to request. The decoder 106 may also perform at least one additional non-key-frame bit-plane channel decoding iteration during a round-trip delay associated with the request. Further, the decoder 106 may obtain at least one of the additional syndrome bit chunks and perform a non-key-frame bit-plane channel decoding iteration using at least one of the additional syndrome bit chunks. Further, the at least one non-key-frame bit-plane channel decoding iteration may be performed using side information, which may be calculated using at least one of: a key-frame and a previously decoded non-key-frame. In some embodiments, the at least one non-key-frame bit-plane channel decoding iteration may utilize an iterative belief propagation.

Figure 9:
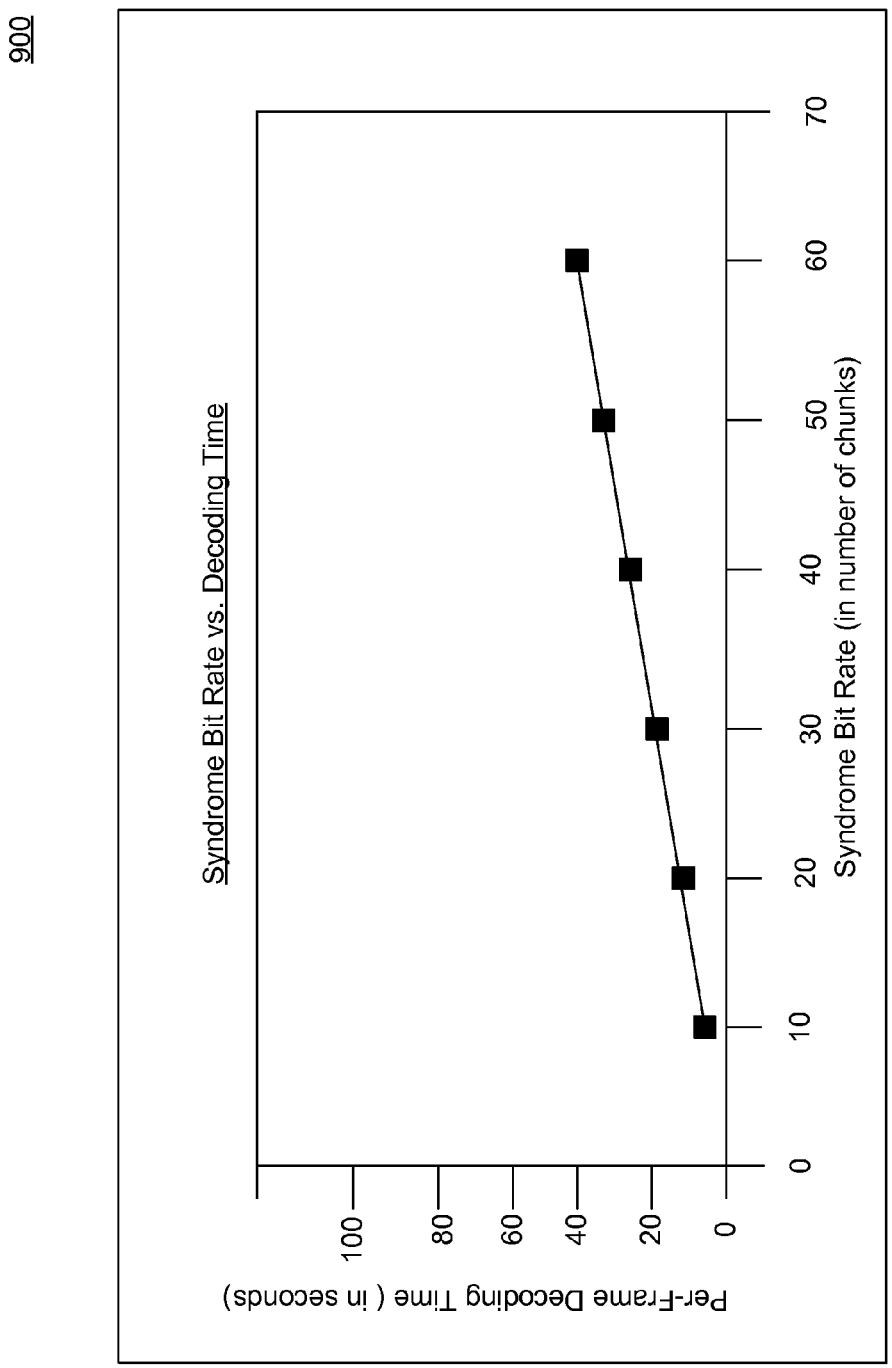
FIG. 9 depicts a graph of the relationship between the syndrome bit rate and decoding time associated with disclosed embodiments.

FIG. 9 depicts an exemplary graph 900 of the relationship between the syndrome bit rate and decoding time for the method discussed above when $t_d*I>t_r$. In an exemplary scenario, assume $t_d$=0.25 milliseconds, I=100 iterations, $t_r$=10 milliseconds, and B=50 bit-planes, where $t_d*I>t_r$, and δ may be calculated as 10/0.25=40 iterations. Here '$t_d$' refers to decoding delay, 'I' refers to number of iterations, 'B' refers to number of bit-planes, and '$t_r$' refers to turn-around delay. The request for additional syndrome bit chunk may be sent after 60 (i.e., I-δ) iterations, if hamming distance condition is satisfied. Additionally, in this example, it is assumed that syndrome bit rates (in chunks) of all bit-planes are same. Further, '1/k' may be considered as 0.5 in this example.

Figure 10:
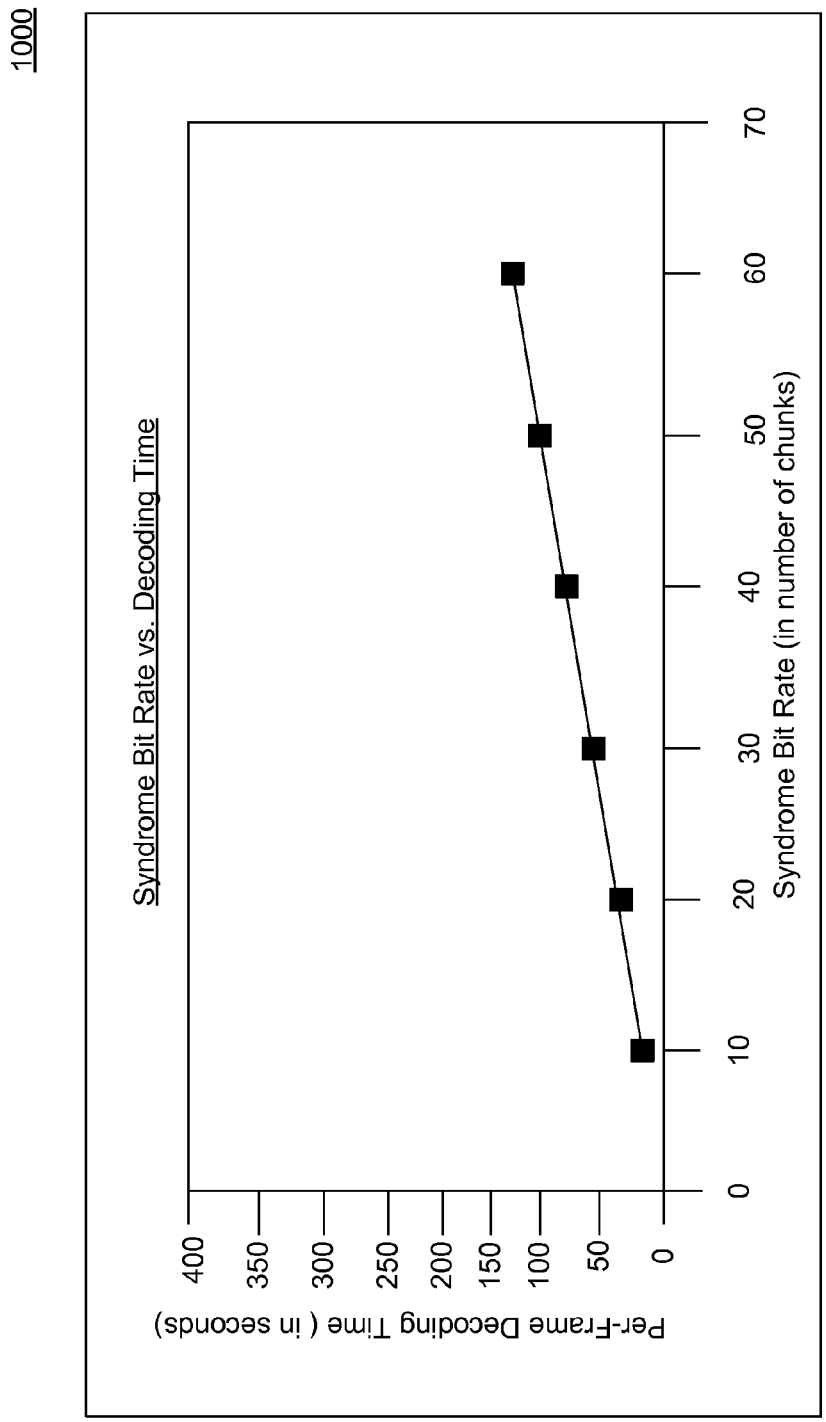
FIG. 10 depicts a graph of the relationship between the syndrome bit rate and decoding time associated with disclosed embodiments.

FIG. 10 depicts another graph 1000 of the relationship between the syndrome bit rate and decoding time for the method discussed above when $t_d*I<t_r$. In an exemplary situation, assume $t_d$=0.25 milliseconds, I=100 iterations, $t_r$=100 milliseconds, and B=50 bit-planes, where $t_d*I<t_r$ and 'δ' may be calculated as 10/0.25=400 iterations. Here $t_d$ refers to decoding delay, 'I' refers to number of channel decoding iterations that may be performed using a single syndrome bit chunk, 'B' refers to number of bit-planes, and $t_r$ refers to turn-around delay. Because the delay expected for performing all the channel decoding iterations possible with the available bit chunks exceeds the round trip delay, the decoder may choose to request additional bit chunks from the encoder as early as possible in the process, so that the requested additional bit chunks become available at the decoder before (or not long after) all the channel decoding iterations possible with the available bit chunks have been completed; thus, the user input 'δ' value may be as high as possible. For example, the user input 'δ' value may be 99 (i.e., I-1). Herein, 'δ' is a predetermined number based on a round-trip delay associated with the request. This means the request for additional syndrome bit chunk(s) may be sent after one iteration if the hamming distance is satisfied. In addition, in this example, it is assumed that the syndrome bit rates (in chunks) of all the bit-planes are the same. Further '1/k' is considered 0.5 in this example.

Exemplary pseudo code for implementing the decoder 106 follows:

```
for i = 1 to b {
    for j = 1 to l {
        cd[i][j] = channel_decode(key frames, syndrome bits)
        d[i][j] = hamming_distance(cd[i][j], syndrome bits)
        if (j == l- δ) {
            D[i][l- δ] = δ*l/d[i][l]
            if (d[i][j] > D[i][l- δ]) {
                chunks_to_request[i][l- δ] = LUT (d[i][l- δ])
                generate_request(chunks_to_request[i][l- δ]) }}
        else {
            If (d[i][j] != 0 & d[i][j] <= D[i][j] & j == l) {
            chunks_to_request[i][l] = LUT (d[i][l])
                generate_request(chunks_to_request[i][l]) }}}
```

In above pseudo code, 'b' refers to bit-plane, 'l' refers to number of iterations, and 'D' refers to the hamming distance.

Additional illustrative embodiments of the invention are listed below. In one embodiment, a tangible computer-readable medium is disclosed, storing processor-executable video encoding instructions for: obtaining a distributed video coding non-key frame; performing distributed video encoding of the non-key frame; generating a plurality of syndrome bit chunks via performing the distributed video encoding; receiving a dynamic multiple syndrome bit chunks request; and providing a subset of the plurality of generated syndrome bit chunks after receiving the dynamic multiple syndrome bit chunks request. Generating the plurality of syndrome bit chunks may utilize adaptive channel encoding. The adaptive channel encoding may be performed as part of Wyner-Ziv encoding. The adaptive channel encoding may generate low-density parity check codes. The low-density parity check codes may encode bit-planes separately. The medium may further store instructions for: providing key frame data for side information generation towards channel decoding.

In another embodiment video encoding system is disclosed, comprising: one or more processors; and a memory device operatively connected to the one or more processors and storing processor-executable instructions for: obtaining a distributed video coding non-key frame; performing distributed video encoding of the non-key frame; generating a plurality of syndrome bit chunks via performing the distributed video encoding; receiving a dynamic multiple syndrome bit chunks request; and providing a subset of the plurality of generated syndrome bit chunks after receiving the dynamic multiple syndrome bit chunks request. Generating the plurality of syndrome bit chunks may utilize adaptive channel encoding. The adaptive channel encoding may be performed as part of Wyner-Ziv encoding. The adaptive channel encoding may generate a low-density parity check code. The low-density parity check code may encode bit-planes separately. The memory device may further store instructions for: providing key frame data for side information generation towards channel decoding.

In one embodiment, a video encoding method is disclosed, comprising: obtaining a distributed video coding non-key frame; performing, via a processor, distributed video encoding of the non-key frame; generating a plurality of syndrome bit chunks via performing the distributed video encoding; receiving a dynamic multiple syndrome bit chunks request; and providing a subset of the plurality of generated syndrome bit chunks after receiving the dynamic multiple syndrome bit chunks request. Generating the plurality of syndrome bit chunks may utilize adaptive channel encoding. The adaptive channel encoding may be performed as part of Wyner-Ziv encoding. The adaptive channel encoding may generate a low-density parity check code. The low-density parity check code may encode bit-planes separately. The method may further comprise: providing key frame data for side information generation towards channel decoding.

Embodiments of the invention may be used in any cloud based network. In addition, at least certain aspects of the aforementioned embodiments may be combined with other aspects of the embodiments, or removed, without departing from the scope of the disclosure.

Other embodiments will be apparent to those skilled in the art from consideration of this disclosure and practice of the embodiments herein. It is intended that the disclosure and examples be considered as exemplary only, with a true scope and spirit of the invention being indicated by the following claims.

What is claimed is:

1. A video decoding method, comprising:
   obtaining side information;
   obtaining a syndrome bit chunk corresponding to a non-key-frame bit-plane;
   performing, via one or more processors, at least one non-key-frame bit-plane channel decoding iteration using the side information and the syndrome bit chunk;
   generating a decoded bit-plane via performing the at least one non-key-frame bit-plane channel decoding iteration;
   determining a bit error rate measure for the decoded bit-plane;
   determining, based on the bit error rate measure, a number of additional syndrome bit chunks to request; and
   providing a request for the additional syndrome bit chunks.

2. The method of claim 1, further comprising:
   performing at least one additional non-key-frame bit-plane channel decoding iteration during a round-trip delay associated with the request.

3. The method of claim 1, further comprising:
obtaining at least one of the additional syndrome bit chunks; and
performing a non-key-frame bit-plane channel decoding iteration using the at least one of the additional syndrome bit chunks.

4. The method of claim 1, wherein obtaining the side information includes calculating the side information using at least one of: a key-frame; and a previously decoded non-key-frame.

5. The method of claim 1, wherein the syndrome bit chunk is obtained from an electronic device.

6. The method of claim 1, wherein the at least one non-key-frame bit-plane channel decoding iteration utilizes an iterative belief propagation algorithm.

7. The method of claim 1, wherein the bit error rate measure for the decoded bit-plane includes a hamming distance (d) between the decoded bit-plane and the obtained syndrome bit chunk.

8. The method of claim 7, wherein determining the number of additional syndrome bit chunks to request comprises:
calculating a hamming distance (D) after a (I-δ)th channel decoding iteration;
wherein I is any number of channel decoding iterations that is performed using a single syndrome bit chunk;
wherein δ is a predetermined number based on a round-trip delay associated with the request;
if $D > (\delta/I)*d$,
determining the number of additional syndrome bit chunks to request based on the hamming distance D; and
if $D \leq (\delta/I)*d$,
calculating a hamming distance (DI) after the I channel decoding iterations, and
determining the number of additional syndrome bit chunks to request based on the hamming distance DI.

9. A video decoding system, comprising:
one or more processors; and
a memory operatively connected to the one or more processors and storing processor-executable instructions for:
obtaining a syndrome bit chunk of a non-key-frame bit-plane;
performing at least one non-key-frame bit-plane channel decoding iteration using the syndrome bit chunk;
generating a decoded bit-plane via performing the at least one non-key-frame bit-plane channel decoding iteration;
determining a bit error rate measure for the decoded bit-plane;
determining, based on the bit error rate measure, a number of additional syndrome bit chunks to request; and
providing a syndrome bit chunk request based on determining the number of additional syndrome bit chunks to request.

10. The system of claim 9, the memory further storing instructions for:
performing at least one additional non-key-frame bit-plane channel decoding iteration during a round-trip delay associated with the request.

11. The system of claim 9, the memory further storing instructions for:
obtaining at least one of the additional syndrome bit chunks; and
performing a non-key-frame bit-plane channel decoding iteration using the at least one of the additional syndrome bit chunks.

12. The system of claim 9, wherein performing the at least one non-key-frame bit-plane channel decoding iteration utilizes side information calculated using at least one of: a key-frame; and a previously decoded non-key-frame.

13. The system of claim 9, wherein the syndrome bit chunk is obtained from a mobile electronic device.

14. The system of claim 9, wherein the at least one non-key-frame bit-Plane channel decoding iteration utilizes iterative belief propagation.

15. The system of claim 9, wherein the bit error rate measure for the decoded bit-plane includes a hamming distance (d) between the decoded bit-plane and the obtained syndrome bit chunk.

16. The system of claim 15, wherein determining the number of additional syndrome bit chunks to request comprises:
calculating a hamming distance (D) after a (I-δ)th channel decoding iteration;
wherein I is any number of channel decoding iterations that is performed using a single syndrome bit chunk;
wherein δ is a predetermined number based on a round-trip delay associated with the request;
if $D > (\delta/I)*d$,
determining the number of additional syndrome bit chunks to request based on the hamming distance D; and
if $D \leq (\delta/I)*d$,
calculating a hamming distance (DI) after the I channel decoding iterations, and
determining the number of additional syndrome bit chunks to request based on the hamming distance DI.

17. A tangible computer-readable medium storing processor-executable video decoding instructions for:
obtaining a syndrome bit chunk of a non-key-frame bit-plane;
performing, via one or more processors, at least one non-key-frame bit-plane channel decoding iteration using the syndrome bit chunk;
generating a decoded bit-plane by performing the at least one non-key-frame bit-plane channel decoding iteration;
determining a bit error rate measure for the decoded bit-plane;
determining, based on the bit error rate measure, a number of additional syndrome bit chunks to request; and
providing a request for the additional syndrome bit chunks.

18. The medium of claim 17, further storing instructions for:
performing at least one additional non-key-frame bit-plane channel decoding iteration during a round-trip delay associated with the request.

19. The medium of claim 17, further storing instructions for:
obtaining at least one of the additional syndrome bit chunks; and
performing a non-key-frame bit-plane channel decoding iteration using the at least one of the additional syndrome bit chunks.

20. The medium of claim 7, wherein performing the at least one non-key-frame bit-plane channel decoding iteration utilizes side information calculated from at least one of: a key-frame; and a previously decoded non-key-frame.

21. The medium of claim 17, wherein the syndrome bit chunk is obtained from an electronic device.

22. The medium of claim 17, wherein the at least one non-key-frame bit-plane channel decoding iteration utilizes an iterative belief propagation algorithm.

23. The medium of claim 17, wherein the bit error rate measure for the decoded bit-plane includes a hamming distance (d) between the decoded bit-plane and the obtained syndrome bit chunk.

24. The medium of claim 23, wherein determining the number of additional syndrome bit chunks to request comprises:
- calculating a hamming distance (D) after a (I-δ)th channel decoding iteration;
- wherein I is any number of channel decoding iterations that is performed using a single syndrome bit chunk;
- wherein δ is a predetermined number based on a round-trip delay associated with the request;
- if $D>(δ/I)*d$,
  - determining the number of additional syndrome bit chunks to request based on the hamming distance D; and
- if $D≤(δ/I)*d$,
  - calculating a hamming distance (DI) after the I channel decoding iterations, and
  - determining the number of additional syndrome bit chunks to request based on the hamming distance DI.

\* \* \* \* \*

UNITED STATES PATENT AND TRADEMARK OFFICE
CERTIFICATE OF CORRECTION

| | |
|---|---|
| PATENT NO. | : 8,924,827 B2 |
| APPLICATION NO. | : 13/752650 |
| DATED | : December 30, 2014 |
| INVENTOR(S) | : Vijay Kumar Kodavalla |

It is certified that error appears in the above-identified patent and that said Letters Patent is hereby corrected as shown below:

In the Claims

In claim 8, column 17, line 20, "claim 7. wherein" should read --claim 7, wherein--.

In claim 14, column 18, line 8, "bit-Plane" should read --bit-plane--.

In claim 20, column 18, line 59, "claim 7, wherein" should read --claim 17, wherein--.

Signed and Sealed this
Thirtieth Day of June, 2015

Michelle K. Lee
*Director of the United States Patent and Trademark Office*